(12) United States Patent
Chen et al.

(10) Patent No.: US 9,330,210 B2
(45) Date of Patent: May 3, 2016

(54) SAND ART SIMULATION SYSTEM AND METHOD

(71) Applicant: NATIONAL CHIAO TUNG UNIVERSITY, Hsinchu (TW)

(72) Inventors: Peng-Yu Chen, New Taipei (TW); Sai-Keung Wong, Hsinchu (TW); Wen-Hsiang Tsai, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 211 days.

(21) Appl. No.: 14/230,144

(22) Filed: Mar. 31, 2014

(65) Prior Publication Data

US 2015/0193952 A1 Jul. 9, 2015

(30) Foreign Application Priority Data

Jan. 7, 2014 (TW) .............................. 103100505 A

(51) Int. Cl.
*G06T 11/20* (2006.01)
*G06F 17/50* (2006.01)
*G06T 11/00* (2006.01)

(52) U.S. Cl.
CPC .......... *G06F 17/5009* (2013.01); *G06T 11/001* (2013.01)

(58) Field of Classification Search
None
See application file for complete search history.

(56) References Cited

FOREIGN PATENT DOCUMENTS

| TW | M257983 | | 2/1993 |
|----|---------|----|--------|
| TW | M366479 | U1 | 10/1998 |
| TW | M377342 | U1 | 4/1999 |
| TW | M391156 | U1 | 10/1999 |
| TW | M421246 | U1 | 1/2012 |
| TW | M456530 | U1 | 7/2013 |

OTHER PUBLICATIONS

Rubaitat Habib Kazi, Kien-Chuan Chua, Shengdong Zhao, Richard C. Davis and Kok-Lim Low, "SandCanvas: A Multi-touch Art Medium Inspired by Sand Animation", CHI 2011, Session: Expression & Perception, May 7-12, 2011.
Peng-Yu Chen and Sai-Keung Wong: "Real-Time Auto Stylized Sand Art Drawing", 2013 CAD/Graphics, Nov. 17, 2013.
Peng-Yu Chen, Sai-Keung Wong and Fu-Shen Li: "Real-Time Auto Drawing for Sand Art", Computer Graphics Workshop 2013 NTHU, Hsinchu, Jul. 12, 2013.

(Continued)

*Primary Examiner* — Peter Hoang
(74) *Attorney, Agent, or Firm* — Rosenberg, Klein & Lee

(57) ABSTRACT

The present invention provides a sand art simulation system and method, which transfers an image into sand art. Analyze contour lines and feature points of objects in the image to find out which contour line can be drawn at the same time. Divide the image into a plurality of blocks, and analyze sand spilling ways at each block. Simulate sand floating in the air, moving and heaping to make a sand-spread plane. Then draw the contour lines on the sand-spread plane to show the sand art of the image.

15 Claims, 10 Drawing Sheets

(56) References Cited

OTHER PUBLICATIONS

Communication from the Taiwan Patent Office Regarding a Counterpart Foreign Application Dated (Taiwan Year 105) Jan. 5, 2016 Citing the Non-Patent Literature of the IDS Filed Feb. 1, 2016.

"Sand Painter—Awakening Fascinating Memories from Childhood"; Currently Available At http://us.newsoft.com.tw/products/product_page.php?P_Id=17 and Corresponds to NPL Orignally Cited in the Taiwan Office Action of Feb. 1, 2016 At Webpage http://www.appguru.com.tw/appguru/apps/73092/the-phone-can-also-be-easy-to-do-sand-painting-chatter-sand-painting-wang-kids-sandpainting-gamet.

(a)　　(b)　(c)　(d) (e)

SAND ART SIMULATION SYSTEM AND METHOD

This application claims priority for Taiwan patent application no. 103100505 filed at Jan. 7, 2014, the content of which is incorporated by reference in its entirely.

BACKGROUND OF THE INVENTION

1. Field of the Invention

The present invention relates to a sand art simulation technology, particularly to a sand art simulation system and method.

2. Description of the Related Art

The photographic technology is growing more and more sophisticated. Further, the image conversion functions of mobile phones are also getting more and more diversified, varying from simple functions of brightness and contrast modification to complicated functions of cartoonized images, retro style images and sketch style images.

The traditional sand painting is to arrange sand into patterns in a sand beach or sandlot. The famous Hungarian sand painting master integrates sand paintings with background music and light projection and makes sand paintings on a lightbox. The type of performance is also called the sand art. In a sand-art performance, the performance table is free of sand initially, and the performer has to spread sufficient sand on some regions of the performance table according to the patterns of the sand painting. The performer has to convert the patterns into many strokes in mind beforehand and then draws the strokes in sequence. The performer can use several fingers to simultaneously draw the strokes of some patterns, such as hair and rivers. Therefore, in the present invention, we examine whether some of the strokes have parallelism or symmetry. If the stokes have at least one of the abovementioned characteristics, they can be drawn simultaneously. The present invention provides an image conversion technology that uses and sand art simulation system and method to convert a digital image into a sand art and make the users seem to view a live performance of a sand art on a screen.

SUMMARY OF THE INVENTION

The primary objective of the present invention is to provide a sand art simulation system and method, which converts a digital image into a sand art, and which analyzes the contour lines of a digital image and draws the digital image in form of a sand art.

Another objective of the present invention is to provide a sand art simulation system and method, which analyzes a digital image to obtain the contour lines of the digital image and the feature points of the contour lines, and stores the feature points of an identical contour line in a queue for automatic drawing, and which connects the feature points in the queue into a contour line after sand spilling.

A further objective of the present invention is to provide a sand art simulation system and method, which divides a sand-spread plane into a plurality of grids each having a size of a sand particle, and uses a heightmap to simulate the behavior of sand particles drifting from the air to the ground, and which evaluates whether the sand particles rebound or roll to other grids according to the velocities, volumes, heights, etc. of the sand particles.

To achieve the abovementioned objectives, the present invention proposes a sand art simulation system, which uses a computer to simulate the process of creating a sand art, and which comprises an image analysis module receiving an image input to the computer, analyzing the image to obtain a plurality of contour lines of the image, types of the contour lines and a plurality of feature points of the contour lines, dividing the image into a plurality of blocks, analyzing the gray levels of each block and the ways of spilling sand particles into the blocks; a sand mobility simulation module simulating the behaviors of sand drifting from the air, sand movements and sand piling, and presenting a sand-spread plane on a screen; a sand manipulation module retrieving and computing the feature points according to the contour line types output by the image analysis module, and presenting all the contour lines on the sand-spread plane sequentially; and a sand art rendering module simulating the extents of light shielding according to the heights of sand particles on the sand-spread plane, and simulating the movements of sand particles after the contour lines are created on the sand-spread plane.

The present invention also proposes a simulation method of a sand art simulation system, which comprises steps: receiving an image input to a computer, analyzing the image to obtain a plurality of contour lines of the image, types of the contour lines and a plurality of feature points of the contour lines, dividing the image into a plurality of blocks, analyzing the gray levels of each block and the ways of spilling sand particles into the blocks; simulating the behaviors of sand particles drifting from the air, sand movements and sand piling, and presenting a sand-spread plane on a screen; retrieving and computing the feature points according to the contour line types output by an image analysis module, and presenting all the contour lines on the sand-spread plane sequentially; and simulating the extends of light shielding according to the heights of sand particles on the sand-spread plane, and simulating the movements of sand particles after the contour lines are created on the sand-spread plane.

DETAILED DESCRIPTION OF THE INVENTION

The present invention pertains to a sand art simulation system and method, which uses virtual particles to simulate the tracks of sand particles drifting from the air. While the sand particles begin to pile on the ground, the present invention uses a heightmap to record the heights of piled sand particles. Then, the present invention simulates the actions that the performer manipulates the sand and automatically coverts a digital image into a sand art. Thereby, the present invention can draw and display a sand art on a touchscreen.

Figure 1:
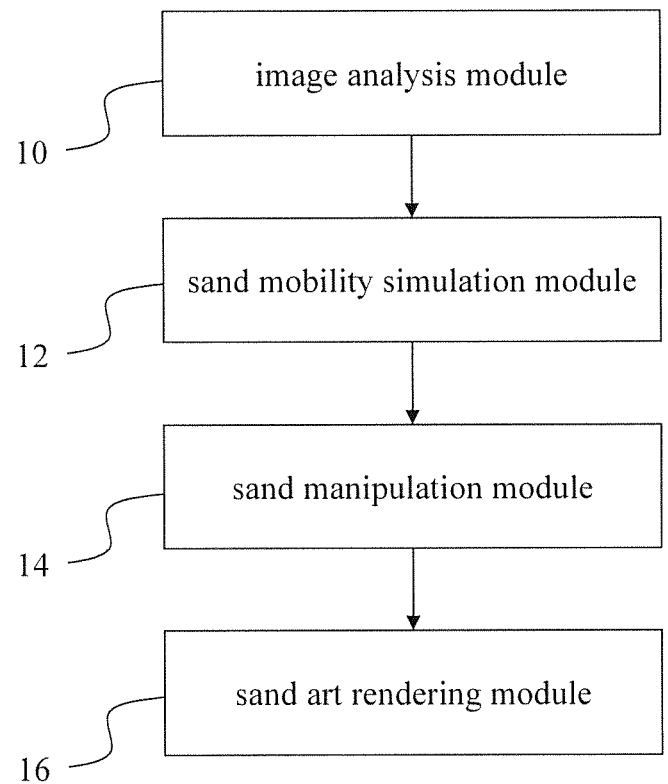
FIG. 1 is a block diagram schematically showing a sand art simulation system according to one embodiment of the present invention.

Refer to FIG. 1 a block diagram schematically showing a sand art simulation system according to one embodiment of the present invention. The sand art simulation system of the present invention comprises an image analysis module 10, a sand mobility simulation module 12, a sand manipulation module 14, and a sand art rendering module 16. The image analysis module 10 receives an image, such as a digital picture or a digital photograph, and analyzes the constituents of the image to obtain a plurality of contour lines of each constituent. The image analysis module 10 uses an edge detection method to obtain information about the contour lines, including the start points, the end points, the thicknesses, and the curvatures of the contour lines. The contour lines respectively have different thicknesses and should be drawn in different ways while they are converted into a sand art. Each contour line has a plurality of feature points, which are normally the inflection points of segments. A contour line can be reproduced by connecting the feature points. The image analysis module 10 searches for feature points in a DFS (Depth First Search) method, which starts to search for feature points from an arbitrary feature point, then searches in circle for the near-by feature points, and finds an unvisited contour point farmost from the current feature point to function as the next point. While no more next point can be found, it means that the contour line of a stroke ends. The image analysis module 10 decomposes a contour line into a plurality of feature points and stores the feature points in a queue according to the searching sequence. An invalid point exists between different contour lines, functioning as a message to break the connection of segments. The image analysis module 10 divides the image into a plurality of blocks, such as 8×8 pieces of blocks, and analyzes the gray levels of each block, and then spills the sand. If a block is darker, more sand is spilt on the block. If none contour line passes through a block, no sand is spilt on the block. The image analysis module 10 will detect whether sand of a block is sufficient and determine whether to spill sand on the block no matter whether sand has been spilt on the block before.

Figure 2A:
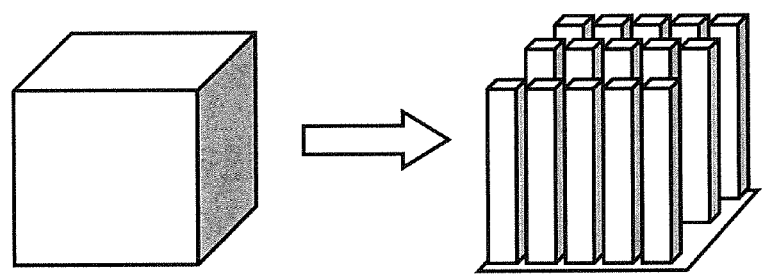
FIG. 2A shows a heightmap of a plurality of grids of a sand-spread plane.
Figure 2B:
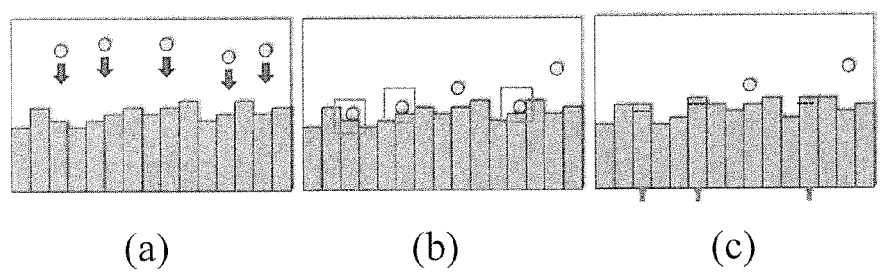
FIG. 2B schematically shows that sand particles drop from the air according to one embodiment of the present invention.
Figure 2C:
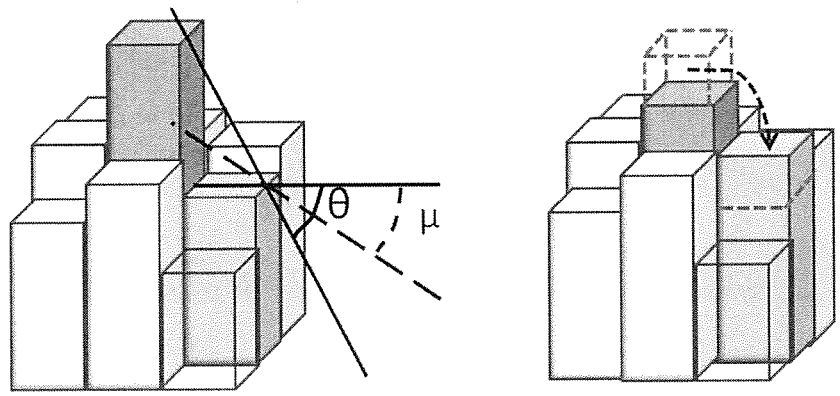
FIG. 2C schematically shows that sand piles collapse according to one embodiment of the present invention.
Figure 2D:
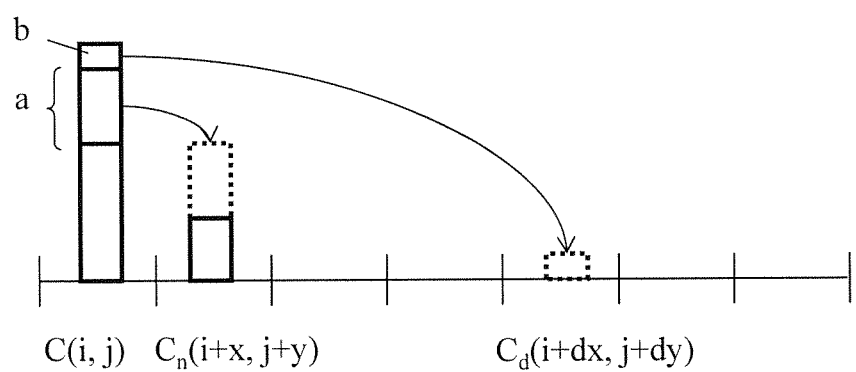
FIG. 2D schematically shows that sand particles rebound according to one embodiment of the present invention.

The sand mobility simulation module 12 simulates the behaviors of sand drifting from the air, sand movements and sand piling, and presents a sand-spread plane on a screen. Sand behaves like a liquid in flowing and preserves its shape like a solid in a static state, and even drifts like a gaseous material in the air. Therefore, the simulation should involve the drifting of sand in the air and the rolling of sand on the ground. The present invention uses a particle-based method to simulate sand mobility, wherein each sand grain is represented by a particle, and the sand-spread plane is divided into a plurality of grids each having a size of a sand grain, and wherein a heightmap is generated to record the heights of sands. As shown in FIG. 2A, each grid involves related information, such as its height and normal vector. The sand mobility simulation module 12 simulates the process that sand particles drop from the air and pile on the ground to have heights, as shown in FIG. 2B. Part (a) of FIG. 2B schematically shows that sand particles drop from the air. Part (b) of FIG. 2B schematically shows that sand particles are falling into grids, wherein some sand particles will integrate with the grids and increase the heights thereof, and some sand particle will rebound to the sand piles of other grids. Part (c) of FIG. 2B schematically shows that three sand particles have integrated with the grids where they fell. If a grid has a height much greater than the heights of the neighboring grids, the sand particles on the grid would roll down in a practical case. Therefore, the simulation should take such a possibility into consideration. Refer to FIG. 2C. Whether a sand pile of a grid will collapse is determined according to the repose angles of the grid with respect to the neighboring eight grids. The tilt angle $\theta$ is the included angle between the horizontal plane and the line connecting the top of a sand pile of a grid and the top of a sand pile of a neighboring grid. The repose angle $\mu$ is the tilt angle of the neighboring grid with respect to another neighboring grid. While the tilt angle $\theta$ of a grid is greater than a preset value or the repose angle $\mu$, it means that the grid is too high. Thus, the sand particle is likely to fall to a lower grid and increase the height of the lower grid until the tilt angle is equal to or smaller than the repose angle. Refer to FIG. 2D for rebound of sand particles. The position which a sand particle rebounds to is calculated according to the altitude and weight of the sand particle. Suppose a sand particle drops into a grid C(i, j) and has an altitude within Region a. Thus, the sand particle will roll to a neighboring grid Cn(i+x, j+y), wherein x and y are the coordinates of the sand particle. Suppose a sand particle drops into a grid C(i, j) and has an altitude within Region b. Because Region b is higher than Region a, the sand particle will rebound to a farther position. In FIG. 2D, the sand particle rebounds to a grid Cd(i+dx, j+dy).

Figure 3A:
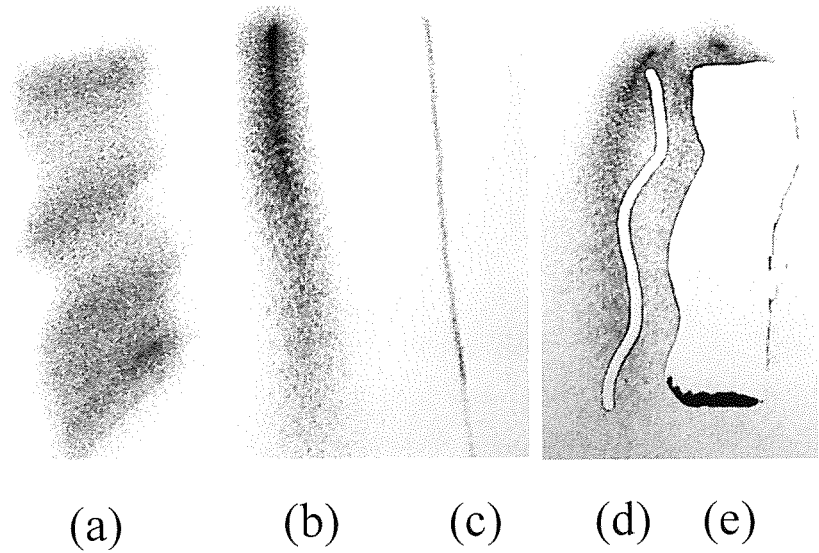
FIG. 3A shows examples of fives types of sand manipulations according to one embodiment of the present invention.

The sand manipulation module 14 retrieves and performs calculation on the feature points of each contour line according the type of the contour line. Different types of contour lines correspond to different types of feature points. The sand manipulation module 14 presents the contour lines on the sand-spread screen in sequence. As shown in FIG. 3A, different types of contour lines correspond to different types of sand manipulations, including (a) pinch spilling (spilling sand on a large area), (b) spilling (spilling sand along a specified direction), (c) leaking (holding a handful of sand and releasing it gradually), (d) erosion (wiping out sand point by point continuously to form a curve on the sand-spread plane), (e) pinch erosion (wiping out sand line by line continuously to form a large area on the sand-spread plane). The contour lines can be classified into colored contour lines and colorless contour lines. The colored contour lines are generated via spilling sand, such as the abovementioned sand manipulations of Types (a), (b) and (c). The colorless contour lines are generated via wiping out sand, such as the abovementioned sand manipulations of Types (d) and (e).

Figure 3B:
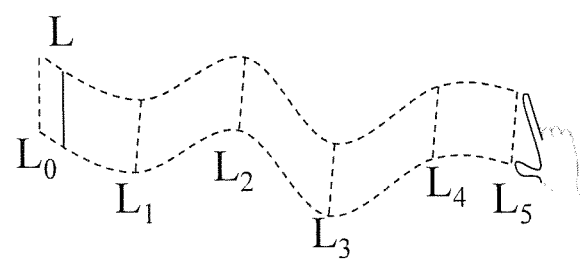
FIG. 3B schematically shows sand pinch spilling (spilling sand on a large area) according to one embodiment of the present invention.
Figure 3C:
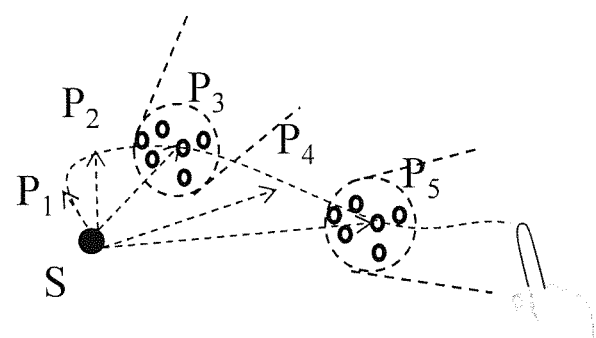
FIG. 3C schematically shows sand spilling (spilling sand along a specified direction) according to one embodiment of the present invention.
Figure 3D:
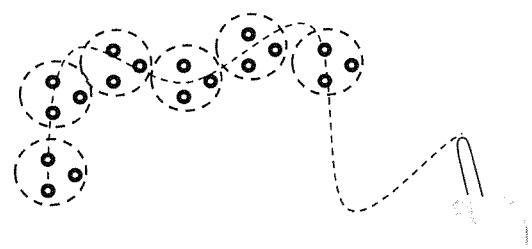
FIG. 3D schematically shows sand leaking (holding a handful of sand and releasing it gradually) according to one embodiment of the present invention.

In Type (a) sand manipulation—pinch spilling, the tips of two fingers touch the screen, and two touch control points form a straight line. Then, the user moves the straight line, and sand is sprayed on the region where the straight line passes. While the user moves his fingers, the sand manipulation module 14 successively stores new segments into the queue. For each grid, a given quantity of segments is taken out from the queue. The sand manipulation module 14 processes 2 pieces of segments each time. For example, $L_0$ is the start point, and the movement passes through feature points, $L_1$, $L_2$, $L_3$, $L_4$ and $L_5$, as shown in FIG. 3B. In Type (b) sand manipulation—spilling, while the tip of a finger slides on the touchscreen, the sand art simulation system grasps the start pint and the end point, calculates the speed v according to the distance between the start point and the end point, and spills sand from the start point to the end point in the speed v. As shown in FIG. 3C, the sand manipulation module 14 spills a group of sand particles at the start point S; then, the track passes through feature points $P_1$, $P_2$, $P_3$, $P_4$ and $P_5$; according to the vectors of the start point S and the feature points, the sand manipulation module 14 works out the deviation angles and spills sand in a normal distribution. In Type (c) sand manipulation—leaking, the function thereof enables the user to spill sand at an assigned position, as shown in FIG. 3D. While the user touches the screen, many sand particles are generated at the touched position. While the sand particles are generated, a tiny horizontal initial speed is given to the sand particles in uniform distribution.

Figure 3E:
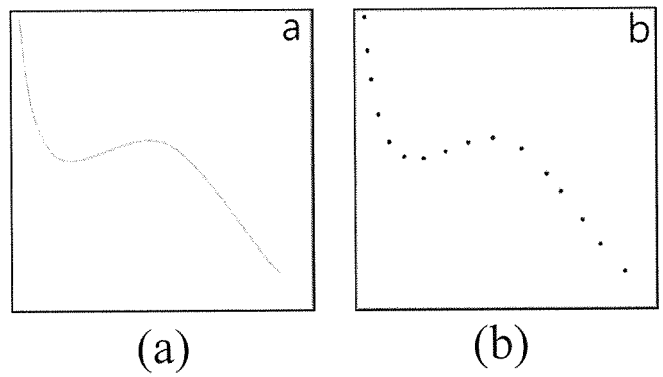
FIG. 3E schematically shows sand erosion (wiping out sand point by point continuously to form a curve on the sand-spread plane) according to one embodiment of the present invention.
Figure 3E:
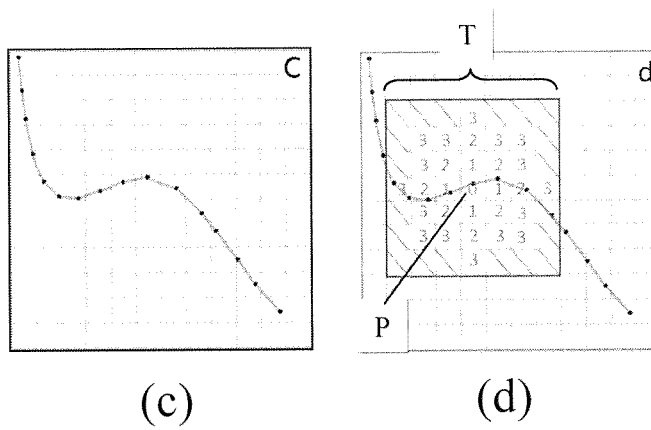

In Types (d) and (e) sand manipulations, the sand manipulation module 14 does not spill sand but wipe out sand. Refer to FIG. 3E. In Types (d) sand manipulation—erosion, after the user uses his finger to draw a curve (as shown in Part (a) of FIG. 3E), the sand manipulation module 14 transforms the curve into a plurality of separated sand points (as shown in Part (b) of FIG. 3E). The sand manipulation module 14 sequentially connects the sand points to form a plurality of segments and undertakes sand arrangement on each integral point of the segments (as shown in Part (c) of FIG. 3E). Then, the sand manipulation module 14 establishes a distance map having a size of TxT, and the grids thereinside are the points of the segments. The number inside a neighboring grid of a specified grid is the distance from the neighboring grid to the specified grid. The dimension of one grid is equal to a distance of one unit. Similarly, the dimension of two grids is equal to a distance of two units, and so on. The sand manipulation module 14 determines the height of a grid according to the distance of the grid. While the distance of a grid is smaller than T/2, the sand manipulation module 14 translates the sand particle of the grid to simulate the sand particles moving together with the finger. While the distance of a grid is between T/2 and T, the sand manipulation module 14 moves the sand particle to a neighboring grid having a greater distance to simulate the sand particles pushed away by the finger. If the speed of finger's movement is greater than a threshold, some stacked sand particles will be spattered out. While the distance of a grid is greater than T, the sand manipulation module 14 does not undertake calculation for the grid. The abovementioned activities are undertaken repeatedly for each point until all the points have been processed. Thereby, the sand manipulation module 14 does not undertake calculation for all the points of the map but only undertakes calculation for the grids influenced by the segments. In Type (e) sand manipulation—pinch erosion, the location where sand wiping starts has two touch control points, and the two touch control points are connected to form a segment $L_0$. The user moves the two touch control points to form a segment $L_1$ at the next time point. The four points of the two segments form a quadrilateral. Then, the sand manipulation module 14 wipes out the sand particles inside the quadrilateral. The abovementioned process will be repeated in the rest of the type of sand manipulation.

The sand art rendering module 16 simulates the extents of light shielding according to the heights of sand on the sand-spread plane and simulates the movements of sand after the contour lines are created on the sand-spread plane. In sand art rendering, each grid represents a pixel. The height of sand on each grid is used to calculate the extent of light shielding. The height of each grid is the sum of the grid's own height, the weighted average height of the neighboring grids and the quantity of the sand particles on the grid. While the height of a grid is zero, the color and brightness of the grid is the same as the background. While the height of a grid is very great, the color and brightness of the grid is near black. While a grid has an intermediary height, the background, the color of sand, and the color of black are used to synthesize the color and brightness of the grid. A sand particle is very tiny and has a size of only 0.004-0.0625 mm. Therefore, the resolution of the screen must be raised to present sand particles. However, high resolution would overburden the processor. Thus, the sand art rendering module 16 detects whether the height of each grid varies in this cycle. If the height of a grid varies, the sand art rendering module 16 calculates the height of the sand stack and redraws the grid anew. If the height of a grid does not vary, the sand art rendering module 16 would not redraw the grid.

Figure 4:
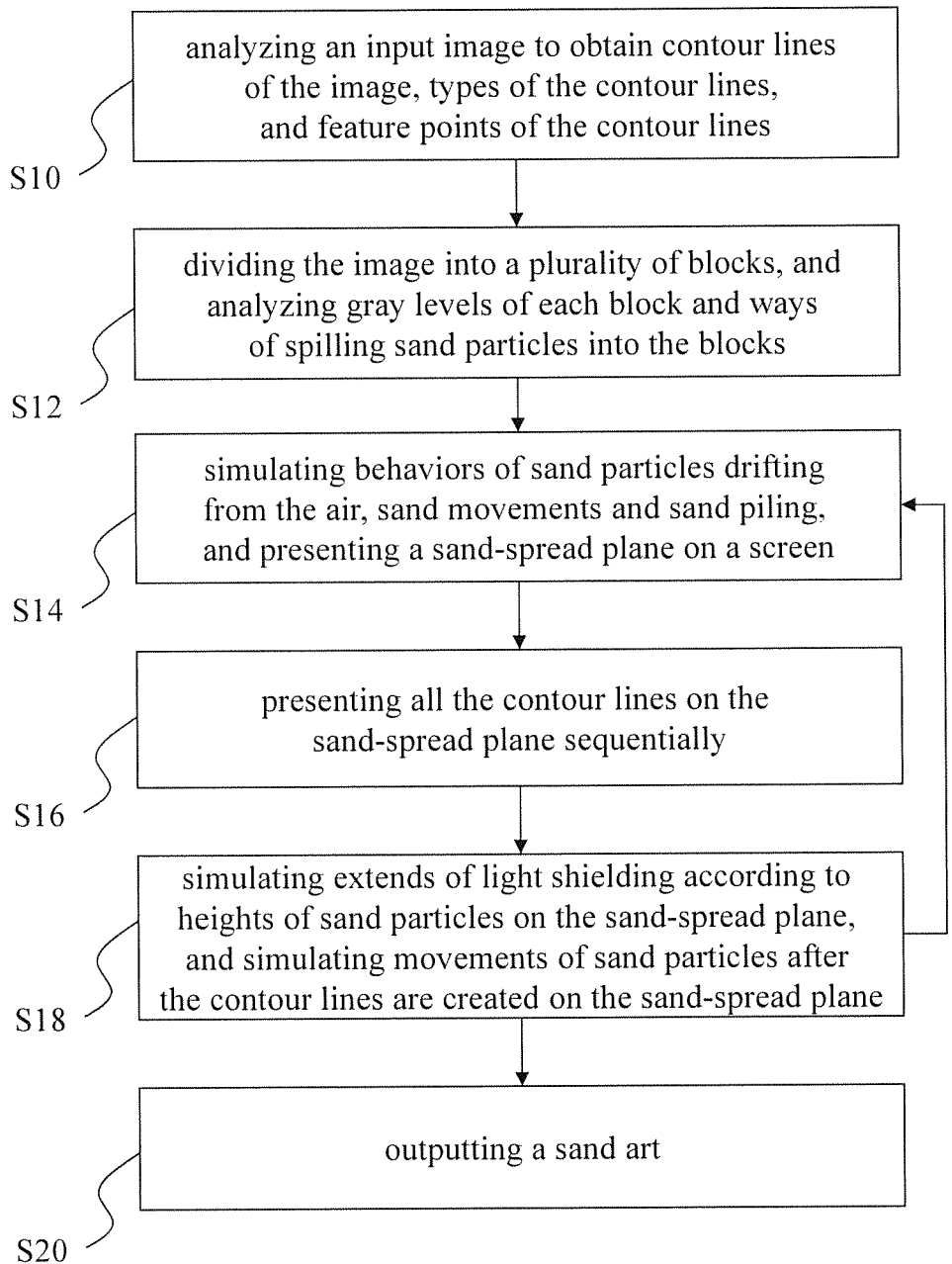
FIG. 4 is a flowchart of a simulation method of a sand art simulation system according to one embodiment of the present invention.
Figure 5A:
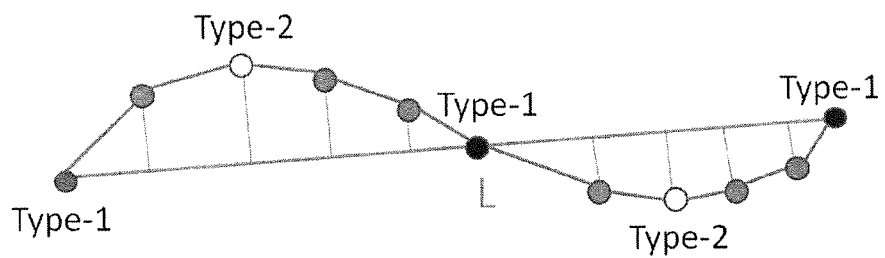
FIG. 5A schematically shows the types of feature points of the contour lines according to one embodiment of the present invention.
Figures 5B, 5C:
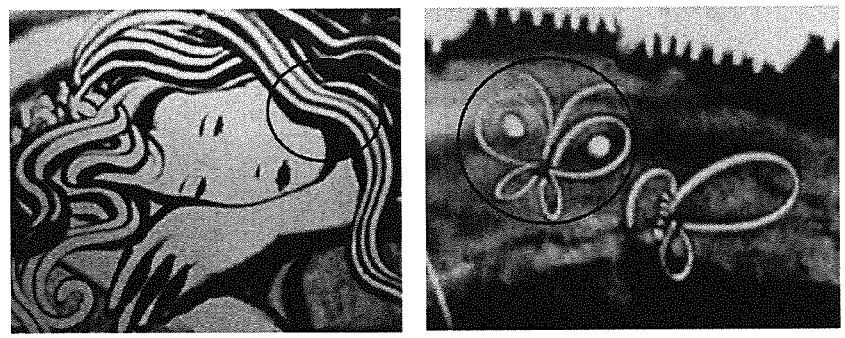
FIG. 5B and FIG. 5C respectively schematically shows two different contour line groups according to one embodiment of the present invention.
Figure 5D:
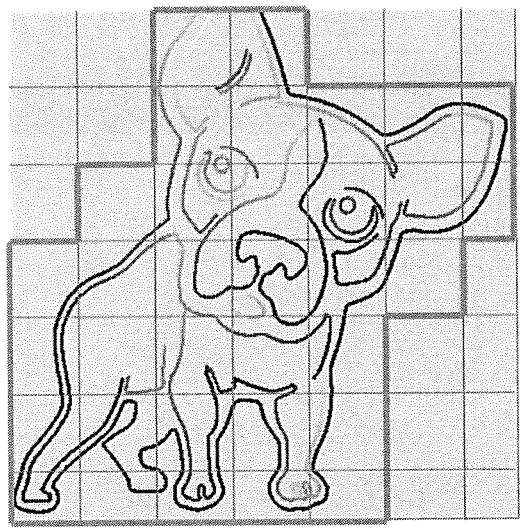
FIG. 5D schematically shows an image is divided into a plurality of blocks according to one embodiment of the present invention.

Refer to FIG. 4 for a flowchart of a simulation method of a sand art simulation system according to one embodiment of the present invention. The method of the present invention can automatically transform a digital image into a sand art. In Step S10, an image analysis module receives an image input to a computer, such as a digital photograph or a digital picture, and analyzes the image to obtain a plurality of contour lines, the types of the contour lines, and the feature points able to form the contour lines. Refer to FIG. 5A a diagram schematically showing the contour lines and feature points. The start and end of the segments are connected to form a connection line. The intersections of the connection line and the contour line are Type one feature points. Type two feature points are the crest points of the waves between every two Type one points. In Step S12, the image analysis module divides the image into a plurality of blocks (as shown in FIG. 5D) and analyzes the gray levels and the ways of sand spilling of each block. In Step S14, a sand mobility simulation module simulates the behaviors of sand drifting from the air, sand movements and sand piling, and presents a sand-spread plane on a screen. In Step S16, a sand manipulation module uses different algorithms to present contour lines sequentially on the sand-spread plane according to the types of contour lines, which are output by the image analysis module in Step S10. According to the types of contour lines, the sand manipulation module undertakes sand spilling and sand wiping on the blocks where contour lines pass, including the abovementioned pinch spilling, spilling, leaking, erosion, and pinch erosion. In Step S18, a sand art rendering module simulates the extents of light shielding according to the heights of sand on the sand-spread plane and simulates the movements of sand after the contour lines are created on the sand-spread plane. The sand art rendering module modifies the sand art. If the sand art simulation system predicts that sand particles roll down, the process returns to Step S14 to simulates the rolling of sand particles and the resultant sand piling. Then, in Step S20, the sand art simulation system outputs a sand art.

In Step S10, after having found out the feature points, the image analysis module further detects whether there are contour line groups. Suppose that there are contour lines, which are close to each other but separated from each other by similar distances, and whose feature points do not intersect. In other words, Type one feature points and Type two feature points of two contour lines do not intersect, and the distance between Type one feature points are similar to the distance between Type two feature points. Thus, these contour lines are regarded as a contour line group, such as the hair region shown in FIG. 5B. Suppose that the y coordinates of the start points of a plurality of contour lines are close to each other and that the feature points thereof do not intersect. Thus, these contour lines are regarded as symmetric contour lines. If these symmetric contour lines are separated by distances short enough, such as the span between two fingers, these symmetric contour lines are regarded as a contour line group, such as the butterfly enclosed by a circle in FIG. 5C. The left wing and right wing of the butterfly are regarded as a contour line group and will be drawn simultaneously.

Figure 6:
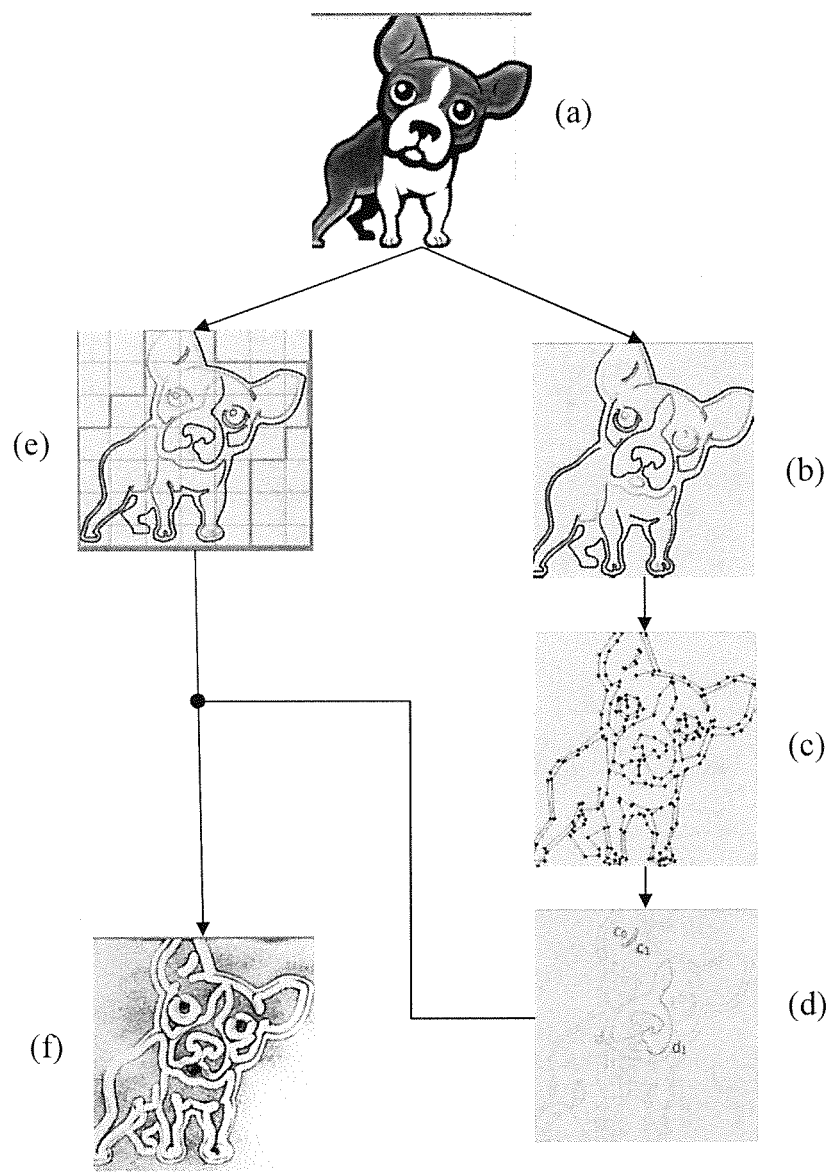
FIG. 6 schematically shows practical operations of an image analysis module according to one embodiment of the present invention.

Refer to FIG. 6 for practical operations of an image analysis module according to one embodiment of the present invention. Firstly, the image analysis module receives an image input to a computer, as shown in Part (a) of FIG. 6. Next, the image analysis module analyzes the image and converts the image into a plurality of contour lines, as shown in Part (b) of FIG. 6. Next, the image analysis module finds out the feature points of the contour lines, as shown in Part (c) of FIG. 6. Next, the image analysis module finds out contour line groups, as shown in Part (d) of FIG. 6. Next, the image analysis module divides the image into a plurality of blocks and analyzes the ways of sand spilling of each block, as shown in Part (e) of FIG. 6. According to the analysis results—the ways of drawing the contour lines and spilling sand, the sand mobility simulation module, sand manipulation module and sand art rendering module take over to finish a sand art, as shown in Part (f) of FIG. 6.

In conclusion, the present invention proposes a sand art simulation system and method, which analyzes an image to obtain the contour lines of the image and the feature points of the contour lines, stores the feature points of the same contour line in a queue for automatic drawing, connects the feature points into a contour line of a picture in a sand manipulation process, whereby a digital image is converted into a sand art.

The embodiments described above are only to exemplify the present invention but not to limit the scope of the present invention. Any equivalent modification or variation according to the characteristic or spirit of the present invention is to be also included within the scope of the present invention.

What is claimed is:

1. A sand art simulation system, which uses a computer to simulate a process of creating a sand art, comprising,
    an image analysis module receiving an image input to said computer, analyzing said image to obtain a plurality of contour lines of said image, types of said contour lines and a plurality of feature points of said contour lines, dividing said image into a plurality of blocks, analyzing gray levels of each said block and ways of spilling sand particles into said blocks;
    a sand mobility simulation module simulating behaviors of sand particles drifting from the air, sand movements and sand piling, and presenting a sand-spread plane on a screen;
    a sand manipulation module retrieving and computing said feature points of said contour lines according to said types of said contour lines, which are output by said image analysis module, and presenting said contour lines on said sand-spread plane sequentially; and
    a sand art rendering module simulating extents of light shielding according to heights of sand particles on said sand-spread plane, and simulating movements of sand particles after said contour lines are created on said sand-spread plane.

2. The sand art simulation system according to claim 1, wherein said image analysis module analyzes start points, end points, thicknesses and curvatures of said contour lines, and groups said contour lines having different thicknesses into different types of said contour lines.

3. The sand art simulation system according to claim 1, wherein said image analysis module divides said sand-spread plane into a plurality of grids each having a size of a sand particle, and wherein a connection line is formed via connecting tops of sand piles respectively on a first one of said grids and a second one of said grids, which neighbors said first one, and wherein if an included angle between a horizontal plane and said connection line is greater than a preset value, height of said first one is transferred to said second one.

4. The sand art simulation system according to claim 1, wherein said contour lines include colored contour lines and colorless contour lines, and wherein said colored contour lines are generated via spilling sand particles, and said colorless contour lines are generated via wiping out sand particles on said sand-spread plane.

5. The sand art simulation system according to claim 3, wherein said sand art rendering module does not evaluate height variation of one said grid unless said grid is affected by sand manipulation.

6. The sand art simulation system according to claim 1, wherein said contour lines, which are close to each other but separated from each other by similar distances, and whose feature points do not intersect, are regarded as of an identical contour line group.

7. The sand art simulation system according to claim 1, wherein said contour lines having start points whose y coordinates are close to each other and having said feature points not intersecting are regarded as symmetric contour lines, and wherein if said symmetric contour lines are separated by distances shorter than a span between two fingers, said symmetric contour lines are regarded as of an identical contour line group.

8. The sand art simulation system according to claim 1, wherein said ways of spilling sand particles include pinch spilling (spilling sand particles on a large area), spilling (spilling sand particles along a specified direction), leaking (holding a handful of sand particles and releasing it gradually), erosion (wiping out sand particles point by point continuously to form a curve on said sand-spread plane), and pinch erosion (wiping out sand particles line by line continuously to form a large area on said sand-spread plane).

9. A simulation method of a sand art simulation system, which uses a computer to simulate a sand art, comprising steps:
    receiving an image input to said computer, analyzing said image to obtain a plurality of contour lines of said image, types of said contour lines, and feature points of said contour lines, dividing said image into a plurality of blocks, and analyzing gray levels of each block and ways of spilling sand particles into said blocks;
    simulating behaviors of sand particles drifting from the air, sand particle movements and sand particle piling, and presenting a sand-spread plane on a screen;
    retrieving and computing said feature points according to said types of said contour lines, which is output by an image analysis module, and presenting all said contour lines on said sand-spread plane sequentially; and
    simulating extends of light shielding according to heights of sand particles on said sand-spread plane, and simulating movements of sand particles after said contour lines are created on said sand-spread plane.

10. The simulation method of a sand art simulation system according to claim 9, wherein said image analysis module analyzes start points, end points, thicknesses and curvatures of said contour lines, and groups said contour lines having different thicknesses into different types of said contour lines.

11. The simulation method of a sand art simulation system according to claim 9, which divides said sand-spread plane into a plurality of grids each having a size of a sand particle, wherein a connection line is formed via connecting tops of sand piles respectively on a first one of said grids and a second one of said grids, which neighbors said first one, and wherein if an included angle between a horizontal plane and said connection line is greater than a preset value, height of said first one is transferred to said second one.

12. The simulation method of a sand art simulation system according to claim 9, wherein said contour lines include colored contour lines and colorless contour lines, and wherein said colored contour lines are generated via spilling sand particles, and said colorless contour lines are generated via wiping out sand particles on said sand-spread plane.

13. The simulation method of a sand art simulation system according to claim 9, wherein said contour lines, which are close to each other but separated from each other by similar distances, and whose feature points do not intersect, are regarded as of an identical contour line group.

14. The simulation method of a sand art simulation system according to claim 9, wherein said contour lines having start points whose y coordinates are close to each other and having said feature points not intersecting are regarded as symmetric contour lines, and wherein if said symmetric contour lines are separated by distances shorter than a span between two fingers, said symmetric contour lines are regarded as of an identical contour line group.

15. The simulation method of a sand art simulation system according to claim 9, wherein said ways of spilling sand particles include pinch spilling (spilling sand particles on a large area), spilling (spilling sand particles along a specified direction), leaking (holding a handful of sand particles and releasing it gradually), erosion (wiping out sand particles point by point continuously to form a curve on said sand-spread plane), and pinch erosion (wiping out sand particles line by line continuously to form a large area on said sand-spread plane).

* * * * *